United States Patent
Lee et al.

(10) Patent No.: US 9,666,727 B2
(45) Date of Patent: May 30, 2017

(54) DISPLAY DEVICE

(71) Applicant: InnoLux Corporation, Miao-Li County (TW)

(72) Inventors: Kuan-Feng Lee, Miao-Li County (TW); Kuo-Chang Chiang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/067,557

(22) Filed: Mar. 11, 2016

(65) Prior Publication Data

US 2016/0315201 A1    Oct. 27, 2016

(30) Foreign Application Priority Data

Apr. 24, 2015   (TW) .................................. 104113169

(51) Int. Cl.
*H01L 29/786*   (2006.01)
*H01L 29/24*    (2006.01)
*H01L 27/12*    (2006.01)
*H01L 29/66*    (2006.01)

(52) U.S. Cl.
CPC .... *H01L 29/78696* (2013.01); *H01L 27/1225* (2013.01); *H01L 29/24* (2013.01); *H01L 29/66969* (2013.01); *H01L 29/7869* (2013.01); *H01L 29/78618* (2013.01)

(58) Field of Classification Search
CPC ........... H01L 27/1225; H01L 29/78696; H01L 29/24; H01L 29/78618; H01L 29/7869
USPC .......................................................... 257/43
See application file for complete search history.

(56) References Cited

U.S. PATENT DOCUMENTS

| | | | | |
|---|---|---|---|---|
| 8,681,057 B2* | 3/2014 | Jung | ...................... | H01Q 1/243 343/702 |
| 8,956,907 B2 | 2/2015 | Ono et al. | | |
| 9,202,926 B2* | 12/2015 | Kishi | .................. | H01L 29/7869 |
| 9,217,106 B2* | 12/2015 | Takeuchi | ............... | C09K 13/06 |
| 9,318,507 B2* | 4/2016 | Miki | .................. | H01L 27/1225 |

(Continued)

FOREIGN PATENT DOCUMENTS

| | | | | |
|---|---|---|---|---|
| JP | WO 2013183726 A1 * | 12/2013 | ............. | C23C 14/08 |
| JP | WO 2013183733 A1 * | 12/2013 | ......... | H01L 29/7869 |

(Continued)

OTHER PUBLICATIONS

Display Week 2015 SID San Jose, Preliminary Program for 2015 SID International Symposium, 18 pages.*

(Continued)

*Primary Examiner* — Earl Taylor
(74) *Attorney, Agent, or Firm* — McClure, Qualey & Rodack, LLP

(57) ABSTRACT

A display device is provided. A thin film transistor structure of the display device includes a substrate, a gate electrode disposed on the substrate, a gate insulation layer disposed on the substrate and the gate electrode, a channel layer on the gate insulation layer and corresponding to the gate electrode, and a source electrode and a drain electrode contacting two sides of the channel layer, respectively, and extending onto the gate insulation layer. The channel layer includes a first metal oxide semiconductor layer, which includes (1) tin and (2) at least one of gallium, hafnium, and aluminum.

10 Claims, 4 Drawing Sheets

(56) References Cited

U.S. PATENT DOCUMENTS

| | | | |
|---|---|---|---|
| 9,324,882 B2* | 4/2016 | Goto | C23C 14/08 |
| 9,343,586 B2* | 5/2016 | Goto | C23C 14/08 |
| 9,431,542 B2* | 8/2016 | Chen | H01L 29/78648 |
| 2010/0096979 A1* | 4/2010 | Lee | C23C 14/086 |
| | | | 313/504 |
| 2011/0298670 A1* | 12/2011 | Jung | H01Q 1/243 |
| | | | 343/702 |
| 2013/0285054 A1* | 10/2013 | Moriguchi | H01L 27/1225 |
| | | | 257/43 |
| 2013/0320328 A1* | 12/2013 | Lee | H01L 29/7869 |
| | | | 257/43 |
| 2013/0335312 A1* | 12/2013 | Sasagawa | G02B 26/001 |
| | | | 345/156 |
| 2014/0009706 A1* | 1/2014 | Moriguchi | G02F 1/1339 |
| | | | 349/42 |
| 2014/0054584 A1* | 2/2014 | Sunamura | H01L 27/092 |
| | | | 257/43 |
| 2014/0147966 A1* | 5/2014 | Nakagawa | G02F 1/136227 |
| | | | 438/104 |
| 2014/0151682 A1* | 6/2014 | Saito | H01L 21/32134 |
| | | | 257/43 |
| 2014/0167038 A1* | 6/2014 | Ahn | H01L 29/7869 |
| | | | 257/43 |
| 2014/0186996 A1* | 7/2014 | Takeuchi | H01L 21/465 |
| | | | 438/104 |
| 2014/0252355 A1* | 9/2014 | Katoh | H01L 29/41733 |
| | | | 257/43 |
| 2015/0034946 A1* | 2/2015 | Saitoh | G02F 1/1345 |
| | | | 257/43 |
| 2015/0076488 A1* | 3/2015 | Kishi | H01L 29/7869 |
| | | | 257/43 |
| 2015/0076489 A1* | 3/2015 | Morita | H01L 29/7869 |
| | | | 257/43 |
| 2015/0084042 A1* | 3/2015 | Maeda | H01L 29/78696 |
| | | | 257/43 |
| 2015/0123116 A1* | 5/2015 | Goto | C23C 14/08 |
| | | | 257/43 |
| 2015/0171221 A1* | 6/2015 | Miki | H01L 21/82346 |
| | | | 257/43 |
| 2015/0206978 A1* | 7/2015 | Miki | H01L 29/7869 |
| | | | 257/43 |
| 2015/0235819 A1* | 8/2015 | Tao | H01J 37/3429 |
| | | | 204/298.13 |
| 2015/0248996 A1* | 9/2015 | Tao | C23C 14/08 |
| | | | 204/298.13 |
| 2015/0255627 A1* | 9/2015 | Goto | C23C 14/08 |
| | | | 257/43 |
| 2015/0295058 A1* | 10/2015 | Morita | H01L 21/32134 |
| | | | 257/43 |
| 2015/0318400 A1* | 11/2015 | Morita | C01G 19/00 |
| | | | 257/43 |
| 2015/0357356 A1* | 12/2015 | Kim | H01L 27/1288 |
| | | | 257/43 |
| 2016/0079437 A1* | 3/2016 | Ochi | H01L 29/7869 |
| | | | 257/43 |
| 2016/0099357 A2* | 4/2016 | Goto | C23C 14/08 |
| | | | 257/43 |
| 2016/0148951 A1* | 5/2016 | Yang | H01L 27/124 |
| | | | 257/72 |
| 2016/0181423 A1* | 6/2016 | Lee | H01L 27/1214 |
| | | | 257/72 |

FOREIGN PATENT DOCUMENTS

| | | | | |
|---|---|---|---|---|
| KR | 20100043517 A | * | 4/2010 | C23C 14/086 |
| KR | 20150027164 A | * | 3/2015 | C23C 14/08 |
| KR | 20150029035 A | * | 3/2015 | C23C 14/08 |
| TW | 201306136 | | 2/2013 | |

OTHER PUBLICATIONS

Sun et al., Amorphous Indium—Gallium—Zinc—Tin—Oxide TFTs with High Mobility and Reliability, SID 2015 Digest, pp. 766-768.*

Ochi et al., Electrical Characterization of BCE-TFTs with a-IGZTO Oxide Semiconductor Compatible with Cu and Al interconnections, SID 2015 Digest, pp. 853-856.*

Chinese language office action dated Sep. 19, 2016, issued in application No. TW 104113169.

* cited by examiner

DISPLAY DEVICE

CROSS REFERENCE TO RELATED APPLICATIONS

This Application claims priority of Taiwan Patent Application No. 104113169, filed on Apr. 24, 2015, the entirety of which is incorporated by reference herein.

BACKGROUND

Technical Field

The disclosure relates to a display device, and in particular it relates to a channel layer composition of a thin film transistor of the display device.

Description of the Related Art

Displays mainly include thin film transistors and other electronic elements. In the structure of a thin film transistor, the general material of the semiconductor layer is amorphous silicon (a-Si). However, the material of the semiconductor layer gradually changes to metal oxide, especially indium gallium zinc oxide (IGZO), which has better electron mobility. When the IGZO semiconductor is selected as the channel layer in the thin film transistor, a liquid etchant such as aluminic acid (Al acid) in general wet etching processes has a low etching selectivity between the IGZO and source/drain electrodes material (e.g. a multi-layered structure of Mo/Al/Mo). In other words, the etching process for patterning the source/drain electrodes also etches the IGZO channel layer. In the worst conditions, the IGZO channel layer is overly etched to be thinner than its predetermined thickness, such that the thin film transistor device cannot be normally operated due to its poor electrical properties.

Accordingly, a novel channel layer composition is called for, so that problems with the operation of the thin film transistor (due to the process of defining the source/drain electrodes simultaneously etching the IGZO channel layer) can be prevented.

BRIEF SUMMARY

One embodiment of the disclosure provides a display device, comprising: a thin film transistor structure, including a channel layer, wherein the channel layer includes a first metal oxide semiconductor layer, which includes (1) tin and (2) at least one of gallium, hafnium, and aluminum.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
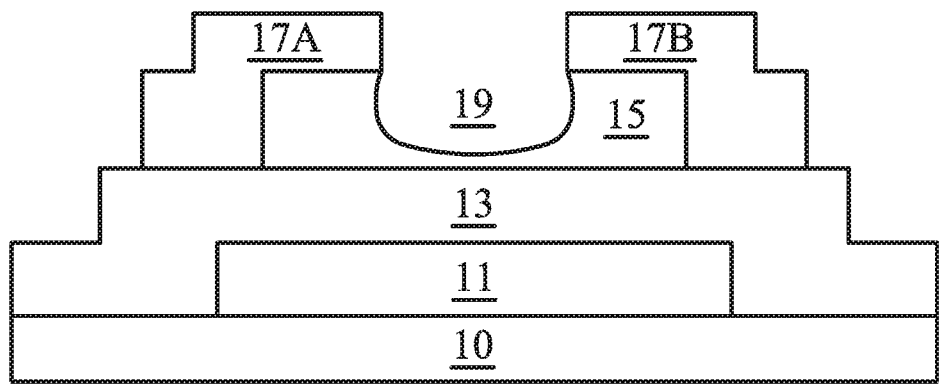
FIG. 1 is a cross section of a thin film transistor structure.
Figure 4:
FIG. 4 shows a display device.

FIG. 4 is a display device such as a liquid crystal display device, which includes a substrate 10, a liquid crystal layer 30, and a color filter substrate 50. FIG. 1 shows a cross section of the substrate 10 with a thin film transistor structure formed thereon. A gate electrode 11, a gate insulation layer 13, and an IGZO channel layer 15 are sequentially disposed on the substrate 10. A source electrode 17A and a drain electrode 17B are disposed on two sides of the IGZO channel layer 15, respectively, and extend onto the gate insulation layer 13. The source electrode 17A and the drain electrode 17B can be fabricated as indicated below. A metal layer (not shown) such as a tri-layered structure of Mo/Al/Mo is formed on the IGZO channel layer 15 and the gate insulation layer 13. A mask layer (not shown) is then formed by lithography to cover the metal layer to be kept. The metal layer of Mo/Al/Mo not covered by the mask layer is then etched by a liquid etchant including aluminic acid, thereby forming the source electrode 17A and the drain electrode 17B. In the above process, the etchant not only etches the metal layer not covered by the mask, but also etches the IGZO channel layer 15 to form a recess 19. In the worst condition, the recess 19 may penetrate through the entire IGZO channel layer 15, such that the penetrated IGZO layer cannot function as a channel layer. In conventional processes, a protection layer is usually formed on the IGZO channel layer 15 to prevent the IGZO channel layer 15 from being influenced by the etching process for defining the source electrode 17A and the drain electrode 17B. However, the protection layer needs an additional photomask and process steps, thereby increasing the cost.

Figure 2A:
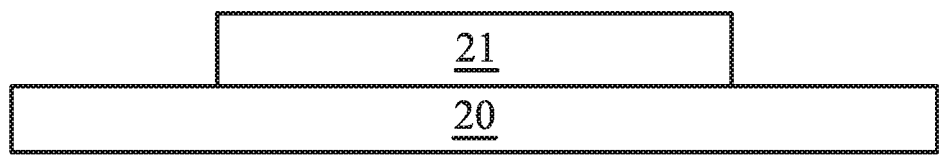
FIGS. 2A to 2D show cross sections of a thin film transistor in various stages during a fabrication in one embodiment of the disclosure.

On embodiment of the disclosure provides a display device with a thin film transistor structure to solve above problem, and the thin film transistor is fabricated by a method as shown in FIGS. 2A to 2D. In FIG. 2A, a gate electrode 21 is formed on a substrate 20. The substrate 20 can be a transparent (e.g. glass, quartz, or the like) or opaque (wafer, ceramic, metal, alloy, or the like) rigid inorganic material, a flexible organic material (e.g. plastic, rubber, polyester, or polycarbonate), an organic/inorganic composite material, or a stack structure thereof. In some embodiments, the substrate 20 is the transparent material, and the final product of the thin film transistor array substrate can be applied in a transmissive, reflective, or transflective liquid crystal display, or a self-illumination display. Alternatively, the substrate 20 is the opaque or low transparent material, and the final product of the thin film transistor array substrate can be applied in a reflective liquid crystal display or a self-illumination display.

In one embodiment, the gate electrode 21 can be formed as shown below: a conductive layer is deposited on the substrate 20 and then patterned to form the gate electrode 21. In one embodiment, the gate electrode 21 has a thickness of 100 nm to 1500 nm. In another embodiment, the gate electrode 21 has a thickness of 300 nm to 1000 nm. The thickness of the gate electrode 21 can be fine-tuned to meet the product requirements. An overly thick gate electrode 21 may influence the yield of film formation and etching, wherein the taper and critical dimension (CD) of the gate electrode 21 cannot be easily fine-tuned. The gate electrode signal is easily distorted by an overly thin gate electrode 21, thereby negatively influencing the operation of the panel. The material of the conductive layer can be metal, alloy, or a multi-layered structure thereof. In some embodiments, the conductive layer is a single-layered or a multi-layered structure of Mo, Al, Cu, Ti, Au, Ag, an alloy thereof, or a combination thereof. The conductive layer can be formed by physical vapor deposition (PVD), chemical vapor deposition (CVD), sputtering, or the like. In one embodiment, the conductive layer can be patterned to form the gate electrode 21 by lithography and etching processes. In general, the lithography process includes following steps: coating the photoresist, soft baking, aligning a photomask, exposure, post exposure baking, development, rinsing, drying such as hard baking, another applicable process, or a combination thereof. The photoresist can be coated by spin-on coating, slit coating, roll coating, inkjet coating, spray coating, or the like. The lithography may form a patterned photoresist. The patterned photoresist may serve as a mask in the etching process for removing a part of the conductive layer, and the etching process can be dry etching, wet etching, or a combination thereof. The patterned photoresist should be removed (e.g. dry ashing or wet stripping) after forming the gate electrode 21.

Figure 2B:
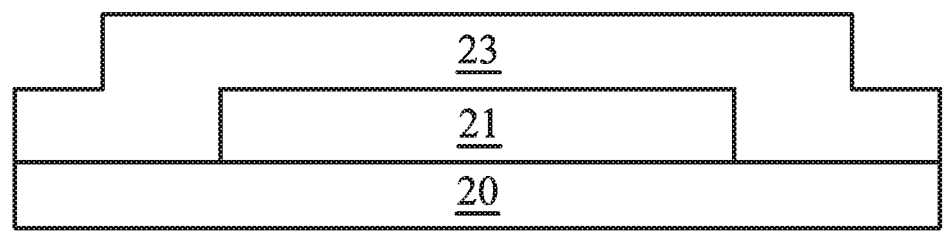

As shown in FIG. 2B, a gate insulation layer 23 is then deposited on the substrate 20 and the gate electrode 21. In one embodiment, the gate insulation layer 23 has a thickness of 100 nm to 1500 nm. In another embodiment, the gate insulation layer 23 has a thickness of 300 nm to 1000 nm. The thickness of the gate insulation layer 23 can be fine-tuned to meet the product requirements. An overly thick gate insulation layer 23 may reduce the charging capability of the thin film transistor. An overly thin gate insulation layer 23 may result in an overly high capacitive coupling between a gate line and a data line, thereby easily distorting the signal. The gate insulation layer 23 can be formed by CVD, PVD, atomic layer deposition (ALD), sputtering, or the like. The gate insulation layer 23 can be silicon oxide, silicon nitride, silicon oxynitride, aluminum oxide, lanthanum oxide, hafnium oxide, hafnium oxynitride, zirconium oxide, another applicable material, or a multi-layered structure stacked from single-layered materials thereof.

Figure 2C:
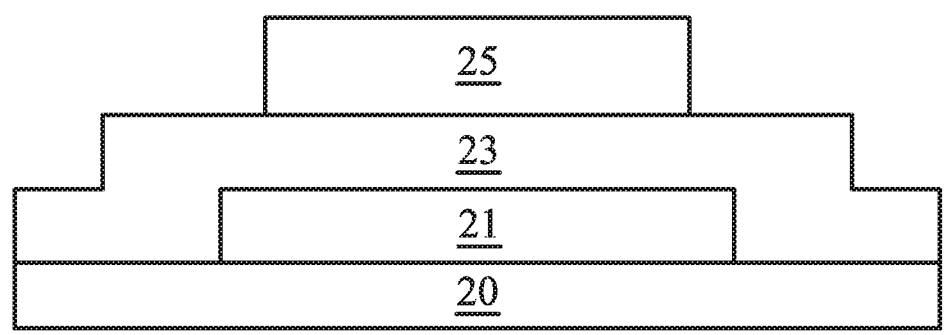

As shown in FIG. 2C, a channel layer 25 is then formed on the gate insulation layer 23, and the channel layer 25 corresponds to the gate electrode 21. In one embodiment, the channel layer 25 can be formed as indicated below: a metal oxide semiconductor layer is formed on the gate insulation layer 23, and then patterned to form the channel layer 25. In one embodiment, the channel layer 25 has a thickness of 10 nm to 160 nm. In another embodiment, the channel layer 25 has a thickness of 30 nm to 100 nm. An overly thick channel layer may easily cause an overly high leakage current of the thin film transistor. An overly thin channel layer 25 may reduce the charging capability of the thin film transistor. In one embodiment, the metal oxide semiconductor of the channel layer 25 includes (1) tin and (2) at least one of gallium, hafnium, and aluminum. For example, the channel layer 25 can be indium gallium zinc tin oxide (IGZTO, a compound containing In, Ga, Zn, Sn, and O). In the IGZTO, tin and indium may have an atomic ratio of 1:1 to 1:1.5. An overly high ratio of indium may enhance the charging capability of the thin film transistor, but it can also easily cause an overly high leakage current of the thin film transistor. An overly low ratio of indium may reduce the charging capability of the thin film transistor. In the IGZTO, tin and gallium may have an atomic ratio of 1:2 to 1:2.5. An overly high ratio of gallium may make the thin film transistor have an overly low charging capability. An overly low ratio of gallium easily increase the oxygen defect in the thin film transistor, such that the thin film transistor has an overly high leakage current. In the IGZTO, tin and zinc may have an atomic ratio of 1:3 to 1:4. An overly high ratio of zinc may make the thin film transistor have an overly low charging capability. An overly low ratio of zinc may make the metal oxide semiconductor be crystallized, thereby negatively influencing the electrical uniformity of the IGZTO. In the IGZTO, tin and oxygen may have an atomic ratio of 1:7 to 1:10. An overly high ratio of oxygen make the thin film transistor have an overly low oxygen defect and an overly low charging capability. An overly low ratio of oxygen may cause an overly high oxygen defect in the thin film transistor. As such, the thin film transistor has a higher charging capability, but easily has an overly high leakage current too. The element of the IGTZO may have the ratios shown below: tin and indium may have an atomic ratio of 1:1.2 to 1:1.4, tin and gallium may have an atomic ratio of 1:2.1 to 1:2.3, tin and zinc may have an atomic ratio of 1:3.3 to 1:3.6, and tin and oxygen may have an atomic ratio of 1:8 to 1:9.5. In a further embodiment, the elements of the IGZTO have atomic ratios of In:Ga:Zn:Sn:O=1.3:2.2:3.5:1:9.

In another embodiment, the metal oxide semiconductor of the channel layer 25 can be indium hafnium zinc tin oxide (IHZTO, a compound containing In, Hf, Zn, Sn, and O). In the IHZTO, each element may have the ratios shown below: tin and indium may have an atomic ratio of 1:1 to 1:1.5, tin and hafnium may have an atomic ratio of 1:2 to 1:2.5, tin and zinc may have an atomic ratio of 1:3 to 1:4, and tin and oxygen may have an atomic ratio of 1:7 to 1:10.

In another embodiment, the metal oxide semiconductor of the channel layer 25 can be indium aluminum zinc tin oxide (IAZTO, a compound containing In, Al, Zn, Sn, and O). In the IAZTO, each element may have the ratios indicated below: tin and indium may have an atomic ratio of 1:1 to 1:1.5, tin and aluminum may have an atomic ratio of 1:2 to 1:2.5, tin and zinc may have an atomic ratio of 1:3 to 1:4, and tin and oxygen may have an atomic ratio of 1:7 to 1:10.

The atomic ratios of the different elements in the channel layer 25 are determined by the process factors of fabricating the metal oxide semiconductor. For example, even if the metal oxide semiconductor is formed by sputtering with a same target (e.g. IGZTO), the sputtering factors such as gas flow rates, power, and/or exhaust gas flow rate can be selected to fine-tune the atomic ratios of tin to indium, gallium, zinc, and oxygen. In one embodiment, an indium gallium zinc tin oxide (IGZTO) target is selected as a sputtering target. As illustrated by 6th generation equipments, the pressure in the sputtering chamber is fine-tuned between 0.2 Pa to 0.7 Pa, the substrate temperature is fine-tuned between room temperature to 200° C., argon flow rate is fine-tuned between 200 sccm to 500 sccm, radio frequency power is fine-tuned between 30 kW to 70 kW, and oxygen flow rate is fine-tuned between 10 sccm to 100 sccm to form a channel layer with the elements of appropriate atomic ratios.

The metal oxide semiconductor layer can be patterned to form a channel layer 25 by the lithography and etching processes. The lithography process is similar to that described above and therefore is omitted here. The patterned photoresist formed by the lithography process may serve as a mask in a wet etching process for removing a part of the metal oxide semiconductor layer. As illustrated by the metal oxide semiconductor of IGZTO, the liquid etchant for wet etching the IGZTO includes oxalic acid. The patterned photoresist should be removed (e.g. dry ashing or wet stripping) after defining the channel layer 25.

Figure 2D:
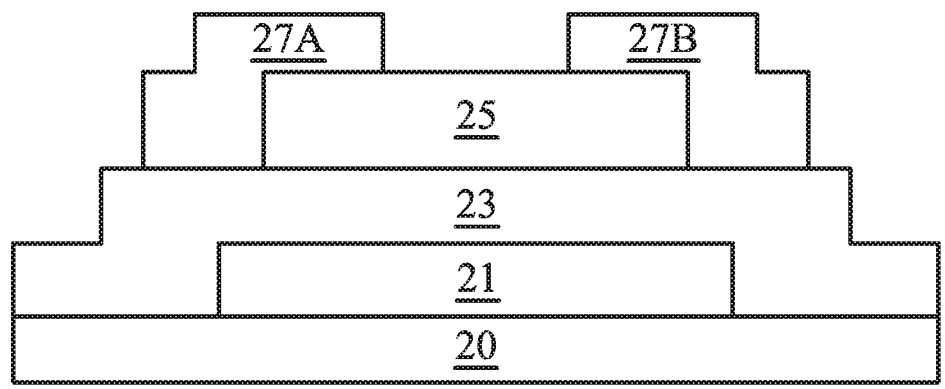

As shown in FIG. 2D, a source electrode 27A and a drain electrode 27B are formed to contact two sides of the channel layer, respectively. The source electrode 27A and the drain electrode 27B extend onto the gate insulation layer 23, respectively. In one embodiment, the source electrode 27A and the drain electrode 27B are formed as shown below: a conductive layer is formed on the channel layer 25 and the gate insulation layer 23, and then patterned to form the source electrode 27A and the drain electrode 27B. In one embodiment, the conductive layer, the source electrode 27A, and the drain electrode 27B have a thickness of 100 nm to 1500 nm, and preferably 300 nm to 1000 nm, which can be fine-tuned to meet the product requirements. An overly thick conductive layer, source electrode 27A, and drain electrode 27B may influence the yield of film formation and etching, wherein the taper and critical dimension (CD) of the source electrode 27A/drain electrode 27B cannot be easily fine-tuned. The gate electrode signal is easily distorted by an overly thin conductive layer, source electrode 27A, and drain electrode 27B, thereby negatively influencing the operation of the panel. In one embodiment, the conductive layer, the source electrode 27A, and the drain electrode 27B includes aluminum, such as a tri-layered structure of Mo/Al/Mo. The aluminum-containing conductive layer can be formed by physical vapor deposition, sputtering, or the like. In one embodiment, the aluminum-containing conductive layer can be patterned to form the source electrode 27A and the drain electrode 27B by the lithography and etching processes. The lithography process is similar to that described above and therefore is omitted here. The patterned photoresist formed by the lithography process may serve as the mask in the etching process for removing a part of the aluminum-containing conductive layer. The aluminum-containing conductive layer can be wet etched by a liquid etchant containing aluminic acid.

In another embodiment, the conductive layer, the source electrode 27A, and the drain electrode 27B includes copper, such as a bi-layered structure of Cu/Ti or Cu/Mo. The copper-containing conductive layer can be formed by physical vapor deposition, sputtering, or the like. In one embodiment, the copper-containing conductive layer can be patterned to form the source electrode 27A and the drain electrode 27B by the lithography and etching processes. The lithography process is similar to that described above and therefore is omitted here. The patterned photoresist formed by the lithography process may serve as the mask in the etching process for removing a part of the copper-containing conductive layer, and the copper-containing conductive layer can be wet etched by a liquid etchant containing hydrogen peroxide.

In another embodiment, the conductive layer, the source electrode 27A, and the drain electrode 27B include titanium, such as a bi-layered structure of Al/Ti or Cu/Ti. The titanium-containing conductive layer can be formed by physical vapor deposition, sputtering, or the like. In one embodiment, the titanium-containing conductive layer can be patterned to form the source electrode 27A and the drain electrode 27B by the lithography and etching processes. The lithography process is similar to that described above and therefore is omitted here. The patterned photoresist formed by the lithography process may serve as the mask in the etching process for removing a part of the titanium-containing conductive layer. The titanium-containing conductive layer can be wet etched by a liquid etchant containing hydrogen peroxide, and then dry etched.

Because the channel layer 25 includes (1) tin and (2) at least one of gallium, hafnium, and aluminum (e.g. IGZTO), the etching step for defining the source electrode 27A and the drain electrode 27B will not influence the channel layer 25. As such, the recess 19 in FIG. 1 can be eliminated to improve the performance of the thin film transistor.

Figure 3:
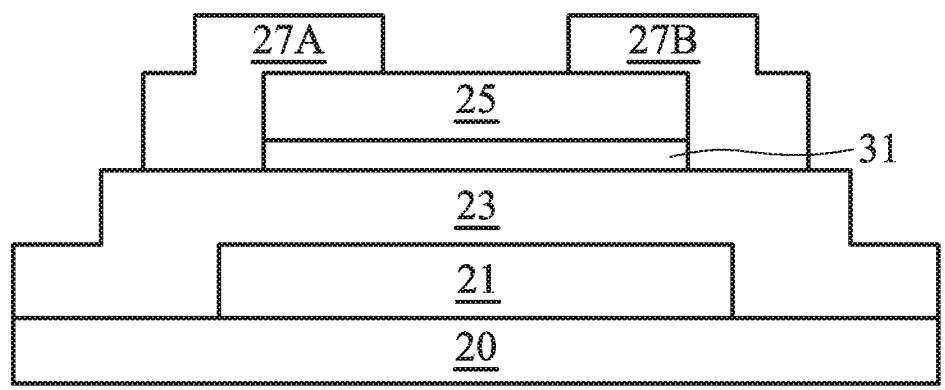
FIG. 3 shows a cross section of a thin film transistor in one embodiment of the disclosure.

In another embodiment, another metal oxide semiconductor layer 31 can be formed under the channel layer 25, as shown in FIG. 3, in which the metal oxide semiconductor layer 31 is disposed between the channel layer 25 and the gate insulation layer 23. The other metal oxide semiconductor layer 31 may serve as a part of the channel layer. In one embodiment, the metal oxide semiconductor layer 31 has a thickness of 5 nm to 30 nm. In another embodiment, the metal oxide semiconductor layer 31 has a thickness of 7 nm to 25 nm. An overly thick metal oxide semiconductor layer 31 may cause a risk such as an overly high leakage current of the thin film transistor. In one embodiment, the metal oxide semiconductor layer 31 includes at least one of gallium, hafnium, and aluminum (e.g. IGZO). In another embodiment, the metal oxide semiconductor layer 31 is free of gallium, hafnium, or aluminum (e.g. indium tin oxide (ITO) or indium zinc oxide (IZO)). Whatever the composition of the metal oxide semiconductor layer 31 is, the fabrication thereof is forming a metal oxide semiconductor layer (for defining the metal oxide semiconductor layer 31) on the gate insulation layer 23, then forming another metal oxide semiconductor layer (for defining the channel layer 25) onto the above metal oxide semiconductor layer, and then performing the lithography and etching processes as described above to simultaneously define the metal oxide semiconductor layer 31 and the channel layer 25.

The stack structure, the process steps, and the relative locations of each element in FIGS. 1, 2A to 2D, and 3 are only for illustration and not limited thereto. One skilled in the art may change the stack structure, the process steps, and the relative locations of each element according to layouts in practice, and these changes belong to the scope of the disclosure.

EXAMPLES

The Examples of the IGZTO channel layer are listed below:

The following factors correspond to 6th generation PVD equipment. After forming a gate electrode and a gate insulation layer on a substrate, an air flow of argon/oxygen with a flow rate of 300 sccm/30 sccm was excited by a low power of 30 kW to 70 kW to form a plasma containing argon ions and oxygen ions. An IGZTO target was bombarded by the plasma to deposit an IGZTO film with a thickness of 50 nm onto the substrate. The IGZTO film was patterned by lithography and etching, and the etching was performed by oxalic acid. After patterning the IGZTO film, forming a metal film of a source electrode and a drain electrode. The metal film was then patterned by lithography and etching, and the etching was performed by aluminic acid (or phosphoric acid/nitric acid/acetic acid) to define the source electrode and the drain electrode. The IGZTO was simultaneously etched by the aluminic acid with a etching rate less than 1 nm/s. Thereafter, the atomic ratios of each element of the IGZTO film was measured by X-ray photoelectron spectroscopy (XPS).

The IGZO film was prepared under similar conditions with a different target (IGZO). The thin film transistor with the IGTZO channel layer was compared to the thin film transistor with the IGZO channel layer using a scanning electron microscope (SEM). The IGTZO channel layer in the thin film transistor still had a thickness of about 50 nm, and the IGZO channel layer in the other thin film transistor was almost etched away by the aluminic acid.

In addition, Examples 1 to 4 in Table 1 illustrate a passivation layer (not shown) formed on surfaces of the source electrode, the drain electrode, and the IGZTO channel layer. The passivation layer was formed by four experiment conditions, and the IGZTO channel layers were then measured to check atomic ratio changes of each element in the IGZTO channel layers. As shown in Table 1, the atomic ratios of each element in the IGZTO channel layers exposed to varied experimental conditions still satisfied the disclosed ranges.

Example 1

The passivation layer was formed by a lower power of 3 kW to 7 kW (e.g. a CVD process) to reduce damage to the IGZTO channel layer.

Example 2

The passivation layer was formed by a higher power of greater than 7 kW (e.g. a CVD process) to increase damage to the IGZTO channel layer.

Example 3

The passivation layer was formed by a lower power of 3 kW to 7 kW (e.g. a CVD process) to reduce damage to the IGZTO channel layer. An additional $N_2O$ treatment was performed before deposition of the passivation layer, thereby determining the influence of the additional treatment for the thin film transistor operation.

Example 4

The passivation layer was formed by a higher power of greater than 7 kW (e.g. a CVD process) to increase the degree of damage done to the IGZTO channel layer. An additional $N_2O$ treatment was performed before deposition of the passivation layer, thereby determining the influence of the additional treatment for the thin film transistor operation.

TABLE 1

|  | In | Ga | Zn | Sn | O | Formulae |
|---|---|---|---|---|---|---|
| Example 1 | 7.5 | 13.2 | 21.3 | 5.7 | 52.3 | $In_{1.32}Ga_{2.32}Zn_{3.74}Sn_1O_{9.18}$ |
| Example 2 | 7.7 | 12.6 | 20.5 | 6.0 | 53.3 | $In_{1.28}Ga_{2.10}Zn_{3.42}Sn_1O_{8.88}$ |
| Example 3 | 7.8 | 13.3 | 21.6 | 5.7 | 51.5 | $In_{1.37}Ga_{2.33}Zn_{3.79}Sn_1O_{9.03}$ |
| Example 4 | 7.4 | 13.1 | 21.6 | 5.7 | 52.2 | $In_{1.30}Ga_{2.30}Zn_{3.79}Sn_1O_{9.16}$ |

Accordingly, a specific element in a specific ratio was doped into the metal oxide semiconductor to serve as a channel in the disclosure, which may resist the wet etchant liquid (e.g. aluminic acid and hydrogen peroxide) usually used in defining the source electrode and the drain electrode. As such, it may prevent the channel layer from over-etching, preventing problems with the operation of device (due to the channel thickness being less than a predetermined thickness).

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a thin film transistor structure, including a channel layer, wherein the channel layer includes a first metal oxide semiconductor layer, which is indium gallium zinc tin oxide (IGZTO), wherein tin and indium have an atomic ratio of 1:1 to 1:1.5, tin and gallium have an atomic ratio of 1:2 to 1:2.5, tin and zinc have an atomic ratio of 1:3 to 1:4, and tin and oxygen have an atomic ratio of 1:7 to 1:10.

2. The display device as claimed in claim 1, further comprising:
   a substrate;
   a gate electrode disposed on the substrate;
   a gate insulation layer disposed on the substrate and the gate electrode;
   the channel layer disposed on the gate insulation layer and corresponding to the gate electrode; and
   a source electrode and a drain electrode separately contacting two sides of the channel layer and extending onto the gate insulation layer.

3. The display device as claimed in claim 1, wherein tin and indium have an atomic ratio of 1:1.2 to 1:1.4, tin and gallium have an atomic ratio of 1:2.1 to 1:2.3, tin and zinc have an atomic ratio of 1:3.3 to 1:3.6, and tin and oxygen have an atomic ratio of 1:8 to 1:9.5.

4. The display device as claimed in claim 2, wherein the channel layer further comprises a second metal oxide semiconductor layer between the first metal oxide semiconductor layer and the gate insulation layer.

5. The display device as claimed in claim 4, wherein the second metal oxide semiconductor layer includes at least one of gallium, hafnium, and aluminum.

6. The display device as claimed in claim 5, wherein the second metal oxide semiconductor layer includes indium gallium zinc oxide (IGZO).

7. The display device as claimed in claim 4, wherein the second metal oxide semiconductor layer is free of gallium, hafnium, or aluminum.

8. The display device as claimed in claim 7, wherein the second metal oxide semiconductor layer includes indium tin oxide (ITO) or indium zinc oxide (IZO).

9. The display device as claimed in claim 2, wherein the source electrode and the drain electrode includes aluminum, copper, or titanium.

10. The display device as claimed in claim 2, wherein the source electrode and the drain electrode is a tri-layered structure of Mo/Al/Mo, a bi-layered structure of Cu/Ti, a bi-layered structure of Cu/Mo, or a bi-layered structure of Al/Ti.

* * * * *